(12) United States Patent
Boukai et al.

(10) Patent No.: US 10,305,014 B2
(45) Date of Patent: May 28, 2019

(54) METHODS AND DEVICES FOR CONTROLLING THERMAL CONDUCTIVITY AND THERMOELECTRIC POWER OF SEMICONDUCTOR NANOWIRES

(71) Applicant: CALIFORNIA INSTITUTE OF TECHNOLOGY, Pasadena, CA (US)

(72) Inventors: Akram Boukai, Mountain View, CA (US); Yuri Bunimovich, Williamsville, NY (US); William A. Goddard, Pasadena, CA (US); James R. Heath, South Pasadena, CA (US); Jamil Tahir-Kheli, Los Angeles, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 367 days.

(21) Appl. No.: 14/924,596

(22) Filed: Oct. 27, 2015

(65) Prior Publication Data

US 2016/0111620 A1    Apr. 21, 2016

Related U.S. Application Data

(63) Continuation of application No. 12/175,027, filed on Jul. 17, 2008, now Pat. No. 9,209,375.

(60) Provisional application No. 60/961,395, filed on Jul. 20, 2007.

(51) Int. Cl.
*H01L 35/26* (2006.01)
*H01L 35/32* (2006.01)
*H01L 35/34* (2006.01)

(52) U.S. Cl.
CPC .............. *H01L 35/26* (2013.01); *H01L 35/32* (2013.01); *H01L 35/34* (2013.01); *H01L 2924/0002* (2013.01)

(58) Field of Classification Search
CPC .......... H01L 35/26; H01L 35/32; H01L 35/34
USPC .......................................................... 136/201
See application file for complete search history.

(56) References Cited

U.S. PATENT DOCUMENTS

| 9,209,375 B2 | 12/2015 | Boukai et al. | |
| 2005/0150537 A1* | 7/2005 | Ghoshal | H01L 35/32 136/205 |
| 2006/0090787 A1* | 5/2006 | Onvural | H01L 35/04 136/212 |
| 2006/0266402 A1* | 11/2006 | Zhang | H01L 35/30 136/205 |
| 2008/0092938 A1* | 4/2008 | Majumdar | B82Y 10/00 136/200 |

FOREIGN PATENT DOCUMENTS

WO    2009/014985 A2    1/2009

* cited by examiner

*Primary Examiner* — Jayne L Mershon
(74) *Attorney, Agent, or Firm* — Steinfl + Bruno, LLP

(57) ABSTRACT

Methods and devices for controlling thermal conductivity and thermoelectric power of semiconductor nanowires are described. The thermal conductivity and the thermoelectric power are controlled substantially independently of the electrical conductivity of the nanowires by controlling dimensions and doping, respectively, of the nanowires. A thermoelectric device comprising p-doped and n-doped semiconductor nanowire thermocouples is also shown, together with a method to fabricate alternately p-doped and n-doped arrays of silicon nanowires.

17 Claims, 10 Drawing Sheets

Imprinting Using a SNAP Master Template

Dry or Wet Etch Techniques

METHODS AND DEVICES FOR CONTROLLING THERMAL CONDUCTIVITY AND THERMOELECTRIC POWER OF SEMICONDUCTOR NANOWIRES

CROSS REFERENCE TO RELATED APPLICATIONS

The present application is a continuation of U.S. patent application Ser. No. 12/175,027 filed on Jul. 17, 2008, which claims the priority benefit of U.S. Provisional Application No. 60/961,395 filed on Jul. 20, 2007 for "High Performance Semiconductor Nanowire Thermoelectrics" by James R Heath, Akram Boukai, Yuri Bunimovich, William A Goddard, and Jamil Tahir-Kheli, the contents of all of which are herein incorporated by reference in their entirety.

STATEMENT OF GOVERNMENT GRANT

The U.S. Government has certain rights in this invention pursuant to Grant No. DE-FG02-04ER46175 awarded by DOE, Grant No. CCF0524490 awarded by National Science Foundation and Grant No. N00014-07-1-0360 & N00014-06-1-0938 awarded by the Office of Naval Research.

BACKGROUND

Field

The present disclosure relates to thermoelectric devices and related fabrication methods. More in particular, it relates to methods and devices for controlling thermal conductivity and thermoelectric power of semiconductor nanowires. It also relates to electric power generators and refrigerators based on semiconductor nanowires. More specifically, the semiconductor nanowires generate electric power wherever a temperature difference exists. They can also be used in reverse as refrigerators whenever an electric current travels through the nanowires.

Related Art

Semiconductors are a class of materials whose electronic properties can be tailored from metallic to insulating. This is accomplished through a process called "doping" whereby a small amount of impurity atoms are injected into the semiconductor by ion implantation or diffusion. Semiconductors can either be made to conduct electrons or holes. Silicon is an example of a semiconductor. For example, silicon is made electron conducting by injection of phosphorus dopants whereas boron dopants make silicon hole conducting. Dopants that render semiconductors electron-rich are called n-type dopants and dopants that render semiconductors hole-rich are called p-type dopants. In general, the electrical conductivity is proportional to the concentration of injected dopants. Thus, the electronic properties can be precisely controlled by controlling the amount of injected dopants. The widespread use of semiconductors in the microelectronic industry is mainly due to the incredible control over their electronic properties.

Nanowires are a class of materials that have length scales for their diameter or width on the order of nanometers to tens of nanometers. The nanometer scale is not easily accessible using conventional lithographic patterning methods found in the microelectronic industry. Instead, the nanoscale may be made accessible using nanowire patterning or nanowire materials growth methods. Typically, nanowires have an aspect ratio (length divided by width or diameter) that is equal to $10^n$ where n typically varies from 1 to 5. The following literature provides representative examples of the fabrication of semiconductor nanowires and their doping:

1. Melosh, N. A. et al. Ultra-high density nanowire lattices and circuits. *Science* 300, 112-115 (2003).
2. Wang, D., Sheriff, B. A. & Heath, J. R. Complementary symmetry silicon nanowire logic: Power-efficient inverters with gain. *Small* 2, 1153-1158 (2006).
3. Morales, A. M. & Lieber, C. M. A laser ablation method for the synthesis of semiconductor crystalline nanowires. *Science* 279, 208-211 (1998).

These three documents are incorporated herein by reference in their entirety.

Thermoelectrics or thermoelectric materials are a class of materials that convert temperature differences into electricity and vice versa. Such materials utilize the Seebeck effect for power generation and the Peltier effect for refrigeration. In the Seebeck effect, a temperature gradient across a thermoelectric material causes the diffusion of charged carriers across that gradient, thus creating a voltage difference between the hot and cold ends of the material. Conversely, the Peltier effect explains the fact that when current flows through a material a temperature gradient arises because the charged carriers exchange thermal energy at the contacts. Therefore, thermoelectric materials can act as either electric power generators in the presence of a temperature difference or as refrigerators when electric current is supplied.

Thermoelectrics are effectively engines that perform these functions without moving parts and they do not pollute. This makes them highly reliable and more importantly attractive as clean power systems, especially at a time when global warming is a growing concern. Other approaches toward power generation or cooling such as fossil fuel based engines emit pollution but are more efficient. As a result, thermoelectrics find only limited use because of their poor efficiency.

The efficiency of a thermoelectric material is determined by the dimensionless figure of merit, $$ZT = \frac{S^2 \sigma}{\kappa} T,$$

where S is the thermoelectric power, defined as the thermoelectric voltage, V, produced per degree temperature difference $$S = \frac{dV}{dT},$$

σ is the electrical conductivity, κ is the thermal conductivity, and T is the temperature. To maximize ZT, and thus the efficiency, S should be large so that a small temperature difference can create a large voltage, σ should be large in order to minimize joule heating losses, and κ should be small to reduce heat leakage and maintain the temperature difference. There is no intrinsic limit to how large ZT can be, but it is generally appreciated that a material with a ZT>1 constitutes a thermoelectric of sufficient efficiency to have at least some practical applications. A thermoelectric with a ZT>3 would be transformative—for example, thermoelectric-based cooling would replace existing compression cycle refrigerators, and thermopower applications for heat recovery or energy conversion would find widespread applications. Currently, the best commercially available thermoelectric devices at room temperature are alloys of $Bi_2Te_3$ and have a ZT of ~1 which corresponds to a Carnot efficiency of ~10%. $Bi_2Te_3$ is an exotic and expensive material to manufacture and thus finding a thermoelectric material with a ZT>1 that is earth abundant and cheap to process would allow more widespread use of thermoelectric devices. Finding a material with a ZT>1, however, is challenging because optimizing one physical parameter often adversely affects another. The following literature provides reviews of thermoelectric devices:

4. MacDonald, D. K. C. *Thermoelectricity: An Introduction to the Principles* (Wiley, New York, 1962).
5. Mahan, G., Sales, B. & Sharp, J. Thermoelectric materials: New approaches to an old problem. *Phys. Today* 50, 42-47 (1997).
6. Chen, G. et al. Recent developments in thermoelectric materials. *Int. Mater. Rev.* 48, 45-66 (2003).
7. Majumdar, A. Enhanced: Thermoelectricity in semiconductor nanostructures. *Science* 303, 777-778 (2004).

These four documents are incorporated herein by reference in their entirety.

In order to demonstrate an efficient thermoelectric, it is important to measure the three material parameters S, σ, and κ, and so calculate ZT. Such measurements can be carried out on nanowires using a variety of on-chip thermometry and electrical leads. The nanowire electrical conductivity is measured by using a 4-point measurement to eliminate contact resistance. For measurement of S and κ a temperature difference is created across the ends of the nanowires by sourcing a DC current through one of the resistive heaters. The resistance rise of each thermometer is recorded simultaneously using a lock-in measurement as the temperature is ramped upwards. The resistance of the thermometers is typically two orders of magnitude smaller than the nanowire array. For measurement of S, the thermoelectric voltage, as a response to the temperature difference, is recorded using a nano-voltmeter. A difference measurement is used to determine κ The following literature provides representative examples of measurements on thermoelectric devices:

8. Boukai, A., Xu., K. & Heath, J. R. Size-dependent transport and thermoelectric properties of individual polycrystalline bismuth nanowires. *Advanced Materials* 18, 864-869 (2006).
9. Yu-Ming, L. et al. Semimetal-semiconductor transition in $Bi_{1-x}Sb_x$ alloy nanowires and their thermoelectric properties. *Applied Physics Letters* 81, 2403-2405 (2002).
10. Small, J. P., Perez, K. M. & Kim, P. Modulation of thermoelectric power of individual carbon nanotubes. *Physical Review Letters* 91, 256801 (2003).
11. Li, S et al. Measuring thermal and thermoelectric properties of one-dimensional nanostructures using a microfabricated device. *Journal of Heat Transfer* 125, 881-888 (2003).
12. Li, D. et al. Thermal conductivity of individual silicon nanowires. *Applied Physics Letters* 83, 2934-2936 (2003)

These five documents are incorporated herein by reference in their entirety.

In the following paragraphs, the challenges in optimizing the three thermoelectric materials parameters are delineated. In addition, the requirements for a practical thermoelectric device are described. Included in each description are the current state-of-the-art procedures and systems for the best thermoelectric devices.

The thermoelectric power varies between different materials. In general, it has been found that the thermoelectric power is approximately 100 times larger for semiconductors than metals. This is the main reason that semiconductors are the material of choice for thermoelectric devices. The magnitude of the thermoelectric power for a semiconductor depends on the doping concentration. Typically, the thermoelectric power is larger for low doped semiconductors and smaller for highly doped semiconductors. In addition, the thermoelectric power usually decreases as the temperature is lowered for highly doped semiconductor metallic systems. However, some semiconductors, such as silicon, have the unique property that their thermoelectric power increases when the temperature is lowered. This behavior is due to phonon drag.

One physical phenomena that, in very specific systems, can increase S, is phonon drag. Phonon drag results when the phonons collide with either electrons or holes and thus impart their momentum to the electronic carriers. The phonons are in essence "pushing" the electrons and holes down the temperature gradient. This results in an extra amount of electronic carriers diffusing down the temperature gradient and a larger voltage develops than would otherwise normally occur if phonon drag was absent. Phonon drag, therefore, leads to a larger thermoelectric power. Phonon drag has long been known to occur in low-doped semiconductors whose electrical conductivity is poor. Therefore, phonon drag has not been successfully exploited in a practical thermoelectric devices since the low electrical conductivity reduces ZT. Increases in the thermoelectric power would be very beneficial as long as no degradation of the electrical conductivity occurs since the thermoelectric power is squared in the expression for ZT. The following literature provides representative examples of observations of phonon drag on semiconductor thermoelectric devices:

13. Weber, L. & Gmelin, E. Transport properties of silicon. *Applied Physics A: Solids and Surfaces* 53, 136-140 (1991).
14. Herring, C. Theory of the thermoelectric power of semiconductors. *Physical Review* 96, 1163-1187 (1954).
15. Geballe, T. H. & Hull, G. W. Seebeck Effect in Silicon. *Physical Review* 98, 940-947 (1955).
16. Behnen, E. Quantitative examination of the thermoelectric power of n-type silicon in the phonon drag regime. *Journal of Applied Physics* 67, 287-292 (1990).
17. Trzcinksi, R., Gmelin, E. & Queisser, H. J. Quenched Phonon Drag in Silicon Microcontacts. *Phys. Rev. Lett.* 56, 1086-1089 (1986).

These five documents are incorporated herein by reference in their entirety.

The electrical conductivity of a semiconductor can be controlled through the doping concentration of impurity atoms. A large doping concentration will result in a large electrical conductivity. In contrast, a low doping concentration will result in a low electrical conductivity. Also, a high doping concentration will result in a lower thermoelectric power so that there is an optimal doping concentration that maximizes $S^2\sigma$, otherwise known as the power factor. Most semiconducting thermoelectric devices are doped to a concentration of $10^{19}$ cm$^{-3}$. This is no easy task for commercially available thermoelectric devices, a majority of which consist of exotic materials. The doping concentration of silicon (and other relatively simple semiconductors such as germanium), on the other hand, can easily be controlled with high precision. Silicon, therefore, is a promising candidate for highly efficient thermoelectrics since its power factor can be optimized. Unfortunately, bulk silicon is characterized by a large thermal conductivity, and this limits the ZT of silicon to near 0.01. The small ZT precludes the use of bulk silicon thermoelectric devices from entering the commercial market.

The thermal conductivity varies widely for many thermoelectric materials. In general, good thermoelectrics have a thermal conductivity below 10 W m$^{-1}$ K$^{-1}$. Silicon, for example, has a thermal conductivity ~150 W m$^{-1}$ K$^{-1}$ at room temperature making it impractical for commercial use. Commercial thermoelectrics based on Bi$_2$Te$_3$ materials have a thermal conductivity of 3 W m$^{-1}$ K$^{-1}$ or lower at room temperature. This value, in combination with its favorable power factor leads to a ZT of ~1 at room temperature. Recently, several groups have used nanostructured materials to increase ZT by using two-dimensional superlattices (i.e. layers of thin films) and zero-dimensional "quantum dots" which have a reduced thermal conductivity relative to their bulk counterparts. However, the materials used in these studies are expensive and rare, and it is not always possible to achieve high efficiencies for both p- and n-type conductors. It is not always straightforward to even prepare both p- and n-type conductors of these systems. Thermopower and thermocooling applications require both p- and n-type thermoelectric materials. The following literature provides representative examples of observations of high ZT on semiconductor thermoelectric devices due to decreased thermal conductivity:

18. Venkatasubramanian, R. et al. Thin-film thermoelectric devices with high room-temperature figures of merit. *Nature* 413, 597-602 (2001).
19. Harman, T. C. et al. Quantum dot superlattice thermoelectric materials and devices. *Science* 297, 2229-2232 (2002).
20. Hsu, K. F. et al. Cubic AgPb$_m$SbTe$_{2+m}$: Bulk thermoelectric materials with high figure of merit. *Science* 303, 818-821 (2004).

These three documents are incorporated herein by reference in their entirety.

Any practical thermoelectric device contains both p- and n-type doped semiconductor elements alternately connected electrically in series and thermally in parallel (as shown in FIG. 1A). One pair of p- and n-type doped semiconductor elements connected in this manner is called a thermocouple. To increase the output voltage, many thermocouples are connected together. The voltage output is given by NV$_{TE}$ where N is the number of thermocouples and V$_{TE}$ is the thermoelectric voltage of one thermocouple. The following reference, incorporated herein by reference in its entirety, describes methods to fabricate p- and n-type thermoelectric elements that are connected electrically in series and thermally in parallel:

21. Snyder, G. J. et al. Thermoelectric microdevice fabricated by a MEMS-like electrochemical process. *Nature Materials* 2, 528-531 (2003)

It is often difficult to dope a semiconductor both p- and n-type. It can also be difficult to precisely control the doping concentration. Silicon, germanium, and their alloys, however, have a distinct advantage over other semiconductors because they can easily be doped p- and n-type. Moreover, repeated and controlled doping of silicon nanowires has been demonstrated. The following reference, incorporated herein by reference in its entirety, describes methods to dope silicon semiconductor nanowires both p- and n-type:

22. Wang, D., Sheriff, B. A. & Heath, J. R. Complementary symmetry silicon nanowire logic: Power-efficient inverters with gain. *Small* 2, 1153-1158 (2006).

In summary, the majority of bulk semiconductors are typically poor thermoelectrics either due to their large thermal conductivity and/or small electrical conductivity. Also, current thermoelectric devices do not take advantage of phonon drag effects. In a typical thermoelectric, the three material parameters thermal conductivity, electrical conductivity, and thermopower are interdependent.

SUMMARY

According to a first aspect, a method of controlling thermal conductivity and thermoelectric power of a material while substantially maintaining electrical conductivity of said material is provided, comprising: providing semiconductor nanowires as said material; controlling the thermal conductivity of the semiconductor nanowires substantially independently of the electrical conductivity of the semiconductor nanowires by controlling dimensions of the semiconductor nanowires; and controlling the thermoelectric power of the semiconductor nanowires substantially independently of the electrical conductivity of the semiconductor nanowires by controlling doping of the semiconductor nanowires.

According to a second aspect, a thermoelectric device comprising p-doped and n-doped semiconductor nanowire thermocouples is provided, said p-doped and n-doped semiconductor nanowire thermocouples being connected electrically in series and thermally in parallel.

According to a third aspect, a method to fabricate alternately p-doped and n-doped arrays of silicon nanowires is provided, comprising: providing a silicon-on-insulator (SOI) substrate; insulating a top silicon layer of the SOI substrate; coating the insulated top silicon layer with photoresist; patterning the photoresist into a series of isolated, alternately p-doped and n-doped, regions separated by insulator; removing the insulator between the isolated regions; etching separation regions under the removed insulator up to an insulator layer of the SOI substrate; removing the photoresist; patterning a plurality of circles on top of each isolated region; etching the isolated regions, the plurality of circles for each isolated region acting as a mask, to obtain, for each isolated region, a nanowire array comprising plurality of nanowires having same diameter as the circles, thus forming alternately p-doped and n-doped arrays of silicon nanowires.

Further embodiments are present in the specification, drawings and claims of the present application.

Applicants have combined experiment and theory to demonstrate that semiconductor nanowires can be designed to achieve enhancements in thermoelectric efficiency, and have shown that the temperature of maximum efficiency may be tuned by changing the doping and the nanowire size. Theory indicates that similar improvements should be achievable for other semiconductor nanowire systems because of phonon effects. These nanowire thermoelectrics may find applications related to on-chip heat recovery, cooling, and power generation. Additional improvements through further optimization of nanowire size, doping, composition, etc., should be possible.

DETAILED DESCRIPTION

Figure 1A:
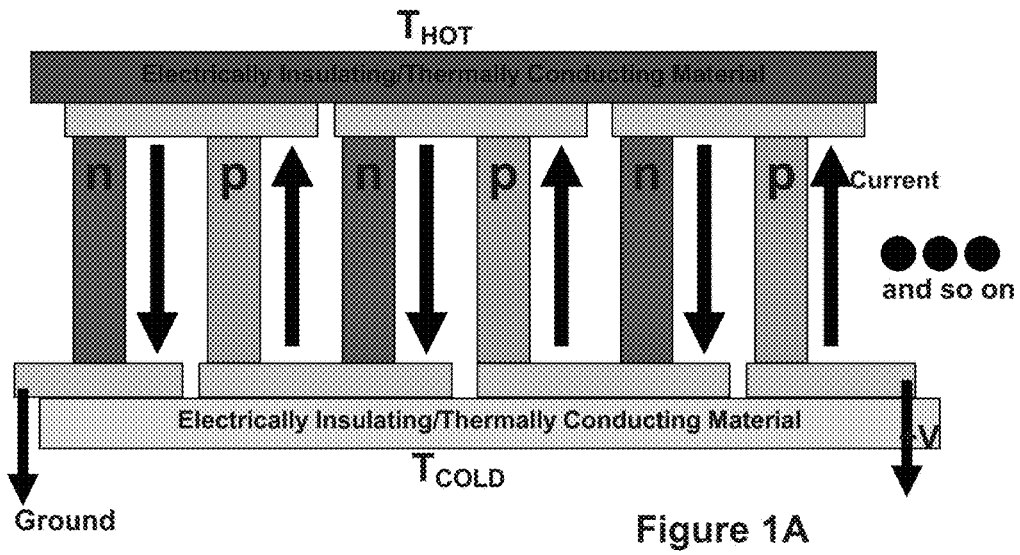
FIGS. 1A and 1B illustrate a thermoelectric device based on bulk p- and n-type thermocouples alternately connected electrically in series and thermally in parallel.

For the very simple system of silicon nanowires, Applicants found that by tuning the nanowires' dimensions, the thermal conductivity is dramatically reduced, while maintaining a high electrical conductivity. Furthermore, Applicants have also found that the thermopower in highly doped (good electrically conducting) nanowires can be increased further by phonon drag. The thermopower depends upon nanowire diameter, nanowire length, and impurity doping. The thermal conductivity depends upon just nanowire diameter. Thus, the present application provides a thermoelectric device that removes the interdependency of the three thermoelectric material parameters that govern ZT. Applicants used silicon nanowires as an example to engineer an excellent thermoelectric material. Silicon is just one example of a semiconducting nanowire material that can be used to fabricate a high efficiency thermoelectric device. Other semiconductor materials such as germanium and alloys of silicon and germanium are likely to increase ZT when fabricated into nanowire form. In general, Applicants have found that any semiconductor nanowire system for which the control of nanowire dimension and impurity doping level is possible will show an increase in efficiency.

In other words, Applicants have found new physics that emerges at the nanoscale, and have harnessed such physics to transform a material that is a poor thermoelectric into an efficient thermoelectric as described below.

According to some of the embodiments of the present disclosure, methods for fabricating silicon nanowire thermoelectric devices with ZT values >1 are described below. As a demonstration, single-crystalline silicon nanowires were fabricated using the Superlattice Nanowire Pattern transfer (SNAP) process (see Reference 1 mentioned above). The nanowires were doped p-type using a boron containing spin-on dopant. Electron-beam lithography (EBL) was used to create Ti/Pt electrodes for the electrical contacts.

According to one of the embodiments of the present disclosure, efficient thermoelectric performance from the single component system of silicon nanowires for cross-sectional areas of 10 nm×20 nm and 20 nm×20 nm has been achieved. Silicon is a viable commercial material due to its overabundance relative to other semiconductor materials in the earth's crust. In addition, the chemistry of silicon is well understood. By varying the nanowire size and impurity doping levels, ZT values representing an approximately 100-fold improvement over bulk silicon are achieved over a broad temperature range, including a ZT~1 at 200K. Independent measurements of S, a, and κ, combined with theory, indicate that the improved efficiency originates from phonon effects. These results are expected to apply to other classes of semiconductor nanomaterials.

Applicants' observed high ZT for silicon nanowires occurs because κ is sharply reduced below the minimum thermal conductivity, $\kappa_{min}=1$ W m$^{-1}$ K$^{-1}$ at room temperature, of bulk amorphous silicon. Also, the phonon drag component of the thermoelectric power, $S_{ph}$, becomes large. Below, Applicants show that $S_{ph}$ increases due to a 3D to 1D dimensional crossover of the phonons participating in phonon drag, and to decreasing κ.

The majority of bulk semiconductors are typically poor thermoelectrics either due to their large thermal conductivity and/or small electrical conductivity. Also, current thermoelectric devices do not take advantage of phonon drag effects. As described below, embodiments of the present disclosure provide for the fabrication of highly efficient thermoelectric devices based on semiconductor nanowires. As a specific example, results of the three thermoelectric material parameters for p-type silicon nanowires are discussed. The unique feature of the silicon nanowires is that they have a dramatically reduced thermal conductivity and exploit the effect of phonon drag. Embodiments of the present disclosure, therefore, provide for the fabrication of thermoelectric nanowire devices with ZT values ≥1. Embodiments of the present disclosure may also allow for thermoelectric nanowire devices to be made from a broad class of semiconductor materials. These are semiconductors that allow for control of their doping level so that the three thermoelectric material parameters can be precisely controlled. Embodiments of the present disclosure may also provide for the fabrication of vertically standing p- and n-type semiconductor nanowires connected electrically in series and thermally in parallel.

Figure 1B:
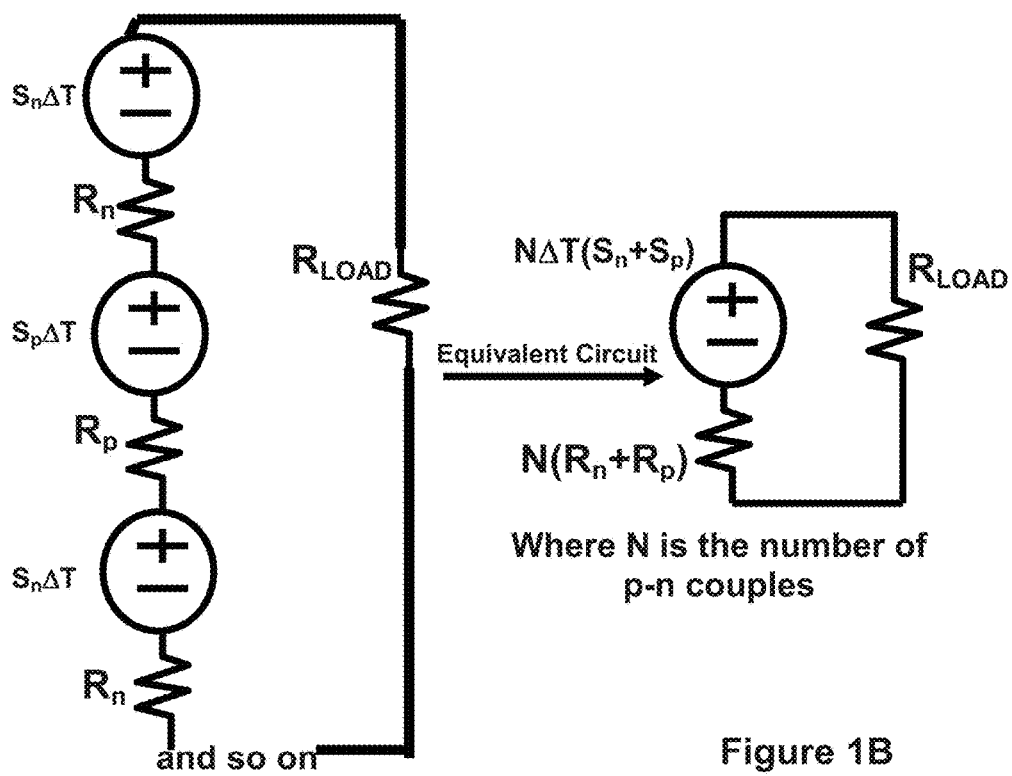

FIG. 1A shows how a typical thermoelectric device is constructed using p- and n-type thermoelectric elements. The elements are alternately connected electrically in series and thermally in parallel. The p- and n-type elements should be connected in this manner to ensure that the output voltage is maximized. Therefore, thermoelectric materials should be optimized for both p- and n-type doping. As the top electrically insulating yet thermally conductive plate is made hotter than the bottom plate, electrons and holes diffuse across the temperature gradient and an electric voltage is produced. This voltage can be used to supply electric power. FIG. 1B shows the equivalent circuit of thermoelectric device in FIG. 1A where N is the number of p-n thermocouples. Each p- and n-type element is modeled as a voltage source that supplies a voltage=SΔT. A source resistance $R_p$ and $R_n$ is associated with each p-type element and n-type element respectively. The total output voltage of this thermoelectric module is $=N\Delta T(S_n+S_p)$.

Figure 2:
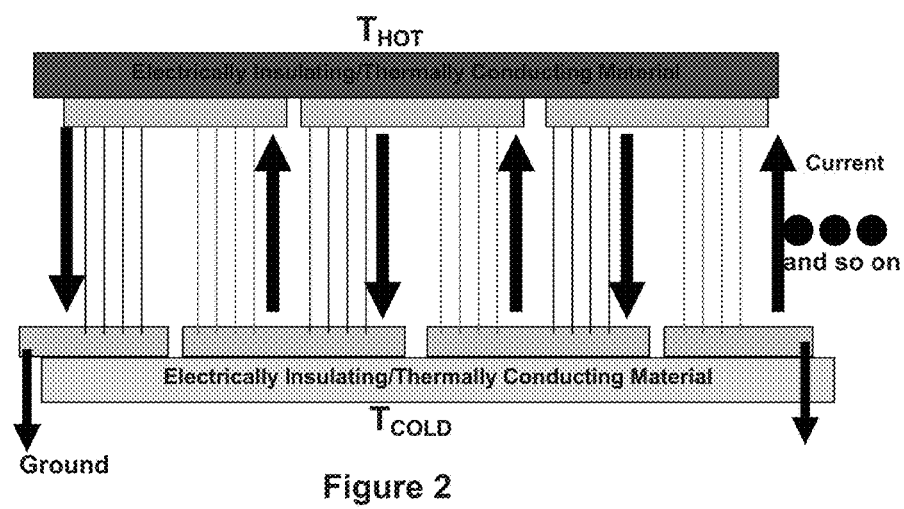
FIG. 2 shows a schematic of an embodiment of the present disclosure, where p- and n-type thermocouples alternately connected electrically in series and thermally in parallel as in FIG. 1A are shown. However, each thermocouple element comprises semiconductor nanowires rather than a bulk piece of material.

FIG. 2 is a schematic of one of the embodiments of the present disclosure. Semiconductor nanowires (shown as thin lines) are connected electrically in series and thermally in parallel and are alternately doped p- and n-type to form a series of thermocouples. This structure takes advantage of the dramatically reduced thermal conductivity and increased thermopower due to phonon drag to increase ZT>1.

Figure 3A:
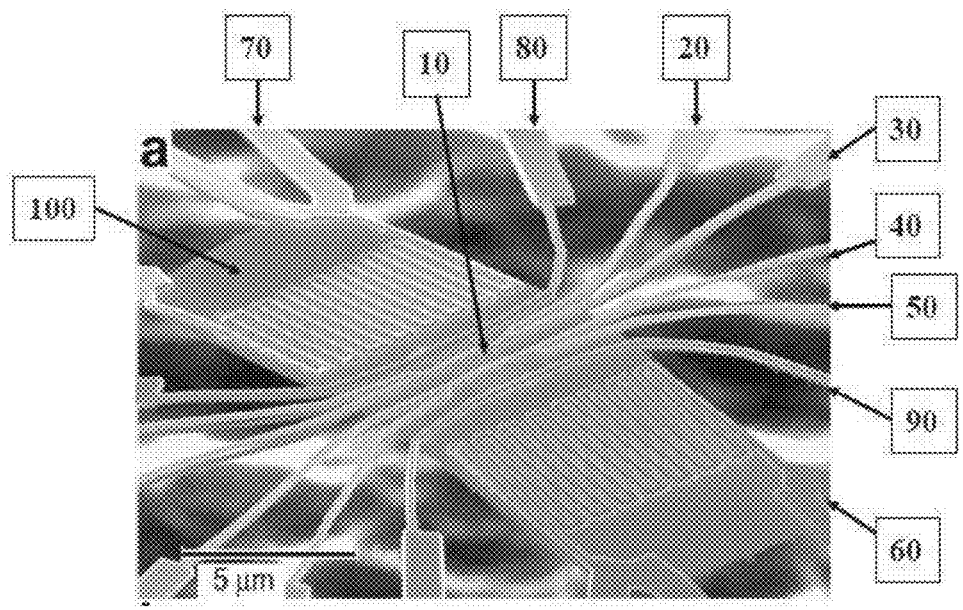
FIGS. 3A-3C show scanning electron micrographs of a device architecture used to quantify ZT of the silicon nanowires in accordance with the disclosure.
Figure 3B:
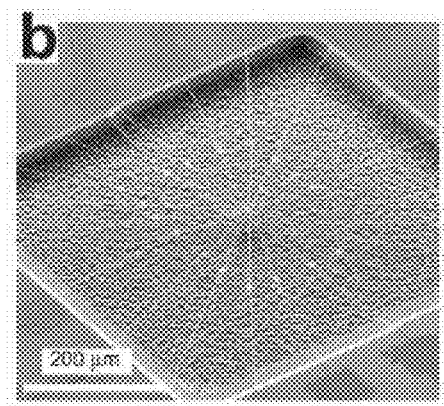
Figure 3C:
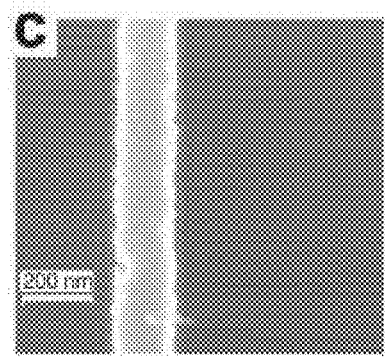

FIGS. 3A-3C show scanning electron micrographs of the device utilized to measure the thermoelectric power and electrical and thermal conductivity of silicon nanowire arrays.

FIG. 3A is a device structure used for measurement of the three thermoelectric material parameters: thermal conductivity, electrical conductivity, and thermopower. The electron micrograph shows an image of a suspended platform with silicon nanowires and all electrical connections. The central area (10) is the silicon nanowire array, which is not resolved at this resolution. According to one of the embodiments of the present disclosure, the silicon nanowires are made using the SNAP process. The 4-lead electrodes (20, 30, 40, 50) are utilized for thermometry to measure the temperature difference across the nanowire array to obtain values for the thermopower. That thermal gradient is established with either of the two Joule heaters (60, 70). The electrodes (20, 30, 40, 50) and (80, 90) are combined to carry out 4-point electrical conductivity measurements on the nanowires. The region (100) underlying the nanowires and the electrodes 150 nm thick $SiO_2$ insulator that is sandwiched between the top Si(100) single crystal film from which the nanowires are fabricated, and the underlying silicon wafer. The underlying silicon wafer etched back to suspend the measurement platform, placing the background of this image out of focus.

FIG. 3B shows a low resolution micrograph of the suspended platform. The electrical connections radiate outwards and support the device.

FIG. 3C shows a high resolution image of an array (110), e.g., of 20 nm wide silicon nanowires with a metal electrode (120), e.g., a Pt electrode.

Figure 4:
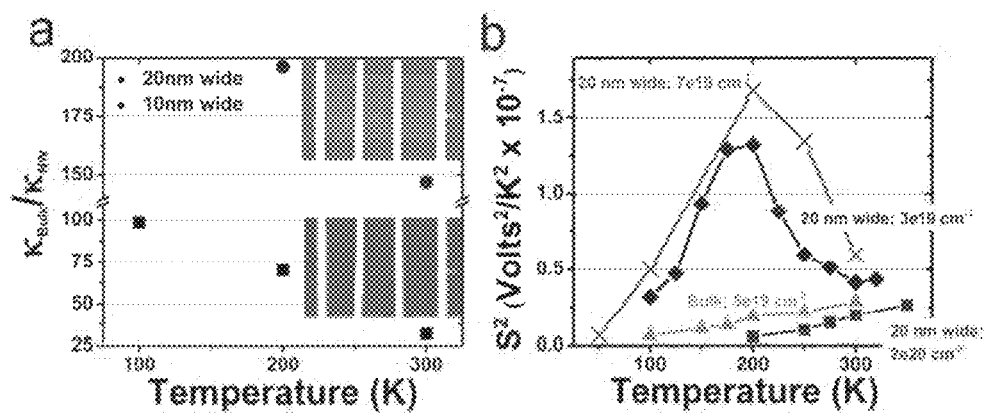
FIG. 4, panels a and b, show the thermal conductivity ratio of bulk silicon to nanowires and thermoelectric power squared data for 20 nm wide and 10 nm wide silicon nanowires. The thermal conductivity and thermoelectric power are used to calculate ZT.

FIG. 4, panels a and b, show factors contributing favorably to ZT for various silicon nanowires.

FIG. 4, panel a, shows the temperature dependence of the thermal conductivity ($\kappa$), presented as $K_{Bulk}/K_{NW}$ to highlight the improvement that the reduction of $\kappa$ in nanowires due to reductions in size lends to ZT. $K_{Bulk}$ values, which are slightly below the true bulk value for silicon, are taken from an identically measured 520 nm×35 nm sized film. The thermal conductivity of the 10 nm wide silicon nanowires is smaller than the minimum thermal conductivity of bulk amorphous silicon. The inset in FIG. 4, panel a, shows micrographs show the region of the device containing the nanowires before (top) and after the $XeF_2$ etch to remove the nanowires.

FIG. 4, panel b, shows the temperature dependence of $S^2$ for 20 nm wide silicon nanowires at various p-type doping concentrations (indicated on the graph). Note that the most highly doped nanowires (lowest line) yield a thermoelectric power similar to that of bulk silicon doped at a lower level. For nanowires doped at slightly higher and slightly lower concentrations than the bulk, S is peaked near 200K. This is a consequence of the one-dimensional nature of the silicon nanowires.

For all but the most highly doped nanowires, S peaks near 200K. This peak is unexpected: similarly doped bulk silicon exhibits a gradual decrease in S as T is reduced (second trace from the bottom). For T<100K a peaked S(T) is observed for metals and lightly doped semiconductors and is due to phonon drag.

Embodiments of the present disclosure exploit phonon drag effects. Phonon drag is generally assumed to vanish with decreasing sample dimensions because the phonon path-length is limited by the sample size. This appears to eliminate phonon drag as the reason for the peak in our nanowires. Below is shown that the phonon wavelengths participating in drag are on the order of or larger than the wire width. This leads to a 3D to 1D dimensional crossover of these modes and removes the cross-sectional wire dimensions from limiting the phonon mean path (see FIG. 5 discussed below). The nanowire boundaries are incorporated into the 1D mode and are not an obstacle to phonon propagation. Therefore, the limiting size becomes the wire length (~1 µm) and phonon drag "reappears" at very small dimensions.

In addition, classical elasticity theory is valid for the phonon wavelengths considered here, leading to thermoelastic damping of sound waves proportional to $\kappa$. Thus $S_{ph}$ is further enhanced due to the observed reduced thermal conductivity $\kappa$. It might appear that elasticity theory leads to a contradiction because $\kappa$ is proportional to the mean phonon lifetime. If the phonon lifetimes increase as stated above, then $\kappa$ should also increase. The resolution is that the elasticity expression is only valid for long wavelength modes.

Below, the electronic and phonon contributions, $S=S_e+S_{ph}$ to the thermoelectric power are considered separately for the nanowire data at T>200K. Charge carriers dissipate heat to the lattice through a process that first involves momentum conserving (non-dissipative) electron-phonon collisions. The phonons that contribute to phonon drag cannot have a wavelength shorter than $\lambda_{min}$, which is determined by the size of the Fermi surface. Phonon drag is observed in metals only at low T because the Fermi surface is large and the heat carrying short wavelength phonons have short lifetimes. At low T (<20K), $S_{ph} \sim T^3$ from the phonon specific heat (~$T^3$). For $kT \gg \Theta_{Debye}$, the specific heat becomes constant and the number of phonons available for phonon-phonon scattering is ~T leading to $S_{ph} \sim 1/T$.

For p-type silicon, the holes are near the valence band maximum. The phonon drag modes are acoustic with largest wavevector, $k_{ph}=2k_{fermi}=0.2$ Å$^{-1}$ (for impurity doping $3 \times 10^{19}$ cm$^{-3}$). The shortest wavelength is $\lambda_{ph}=2\pi/k=31$ Å. Umklapp (non-momentum conserving) phonon-phonon scattering processes determine the rate of phonon heat dissipation. The Debye energy ($\Theta_D$) sets the energy scale for Umklapp scattering. The number of Umklapp phonons available to dissipate the long wavelength phonons is given by the Bose-Einstein function $$N_U = \frac{1}{e^{\Theta_D/T} - 1}$$

leading to a scattering rate $1/\Sigma_{ph} \sim N_U$. When $T \gg \Theta_D$, $1/\Sigma_{ph} \sim T$. Since $\Theta_{Debye}=640K$ for silicon, the full Bose-Einstein expression should be applied for T≤350K.

The electronic contribution ($S_e$) is estimated from the Mott formula $$S_e(T) = \frac{\pi^2 k^2 T}{3e} \left( \frac{\partial \ln \sigma(\varepsilon)}{\partial \varepsilon} \right) \approx (283 \ \mu V/K)(kT/E_f),$$

where the conductivity derivative equals the reciprocal of the energy scale over which it varies (the Fermi energy $E_f$). Assuming hole doping occurs in the heavier silicon valence band (mass 0.49), this leads to $E_f=0.072$ eV=833K and $k_f=0.1$ Å$^{-1}$ for n=$3 \times 10^{19}$ cm$^{-3}$. Thus $S_e(T)=aT$ where a=0.34 µV/K$^2$.

Figure 6:
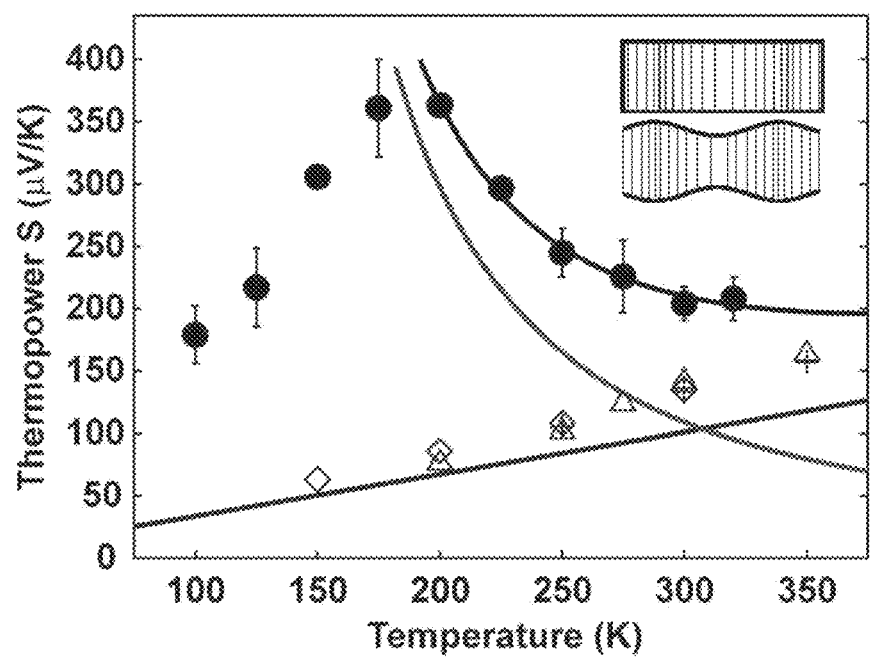
FIG. 6 shows agreement of the theoretical fit to experimental data of the thermoelectric power. The theoretical fit takes into account contributions from phonon drag.

The T>200K thermoelectric power data of the 20 nm wire (doping n=$3 \times 10^{19}$ cm$^{-3}$) fits $$S = S_e + S_{ph} = aT + b[\exp(\Theta_D/T) - 1]$$

where a, b and $\Theta_D$ are varied to obtain the best fit (see FIG. 6). The coefficients are a=0.337 μV/K², b=22.1 μV/K, and $\Theta_{Debye}$=534 K. The coefficient a is almost identical to our estimate of 0.34 μV/K². Thus phonon drag explains the observed thermoelectric power. Consistent with measurements of phonon drag in bulk silicon, S in our nanowires increases significantly at lighter doping.

The phonon drag contribution to S is of the form $$S_{ph} \sim \left(\frac{\tau_{ph}}{\mu T}\right).$$

$\Sigma_{ph}$, the phonon lifetime, is ~1/κ from elasticity theory. μ is the electron mobility. ZT scales as (neglecting $S_e$)

$$S_{ph} \sim \frac{1}{\mu T \kappa}, \quad \sigma \sim n\mu, \quad ZT \sim \frac{n}{\mu T \kappa^3},$$

leading to increased ZT with decreasing mobility. This is opposite the conclusion reached when considering only $S_e$.

Embodiments of this disclosure may allow dramatically reduced thermal conductivities in semiconductor nanowires over bulk values.

Figure 5A:
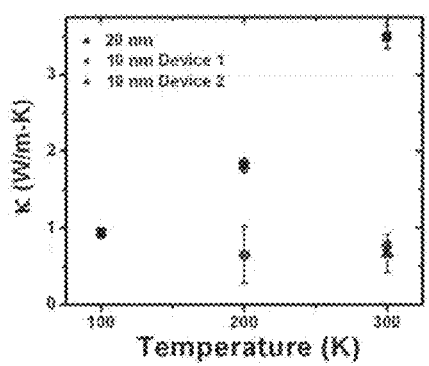
FIGS. 5A and 5B show thermal conductivity of the 20 nm and 10 nm silicon nanowires and thermoelectric power of 20 nm nanowires for various doping concentrations.

FIG. 5A shows the dramatically reduced thermal conductivity of silicon thermoelectric nanowires which increases ZT. The thermal conductivity is reduced due to phonon effects that are present only at the nanoscale dimensions used here. The 10 nm wide silicon nanowires have a thermal conductivity below that of the minimum thermal conductivity of bulk amorphous silicon, $\kappa_{min}$. Conventional wisdom states that thermal conductivity of silicon cannot be below $\kappa_{min}$. However, the derivation of $\kappa_{min}$ is based on several assumptions. First, the derivation of $\kappa_{min}$ assumes that the minimum path length of wavelength A phonons is (½)λ and that the phonons are described by the Debye model using bulk sound speeds with no optical modes. The (½)λ value is an order of magnitude estimate and is difficult to determine precisely in analogy to the minimum electron mean free path used to calculate the Mott-Ioffe-Regel $\sigma_{min}$. Also, $\kappa_{min}$ is proportional to the transverse and longitudinal acoustic speeds of sound. These are reduced in our nanowires at long wavelengths because the modes become 1D. The ratio of the 1D to 3D longitudinal speeds of sound is $[(1+v)(1-2v)/(1-v)]^{1/2}=0.87$ where v=0.29 is the Poisson ratio of silicon. The transverse acoustic speed goes to zero at long wavelength since co ω~k²d where d is the nanowire width. Thus the bulk $\kappa_{min}$ estimate above is invalid for our nanowires and values smaller than $\kappa_{min}$ are attainable.

Figure 5B:
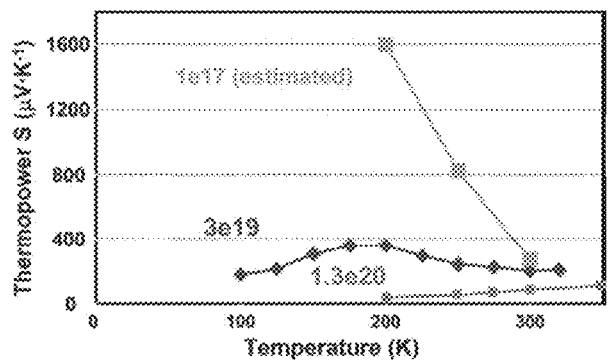

FIG. 5B shows further evidence for phonon drag. The phonon drag effect increases as semiconductor doping concentrations decreases and thus increases ZT. Phonon drag effects are typically only seen in bulk materials. Phonon drag effects "re-appear" at the nanoscale dimension studied here. The doping level of the low-doped sample (upper curve) was estimated from nanowire conductivity measurements, instead of 4-point conductivity measurements of the silicon-on-insulator film from which the nanowires were fabricated. As the doping is decreased, the measured S increases dramatically. This is consistent with phonon drag observed in lightly doped semiconductors. At lower doping, the Fermi surface is smaller and long wavelength acoustic phonons absorb the electron momentum. Since long wavelength phonons have longer lifetimes, the phonon drag contribution to the thermopower increases as the doping decreases.

FIG. 6 shows the close agreement of the theoretical calculation to the experimental data. The thermoelectric power calculation is plotted along with experimental data (black points) from a 20 nm wide silicon nanowire p-type doped at $3\times10^{19}$ cm$^{-3}$. The top curve is the fitted expression for the total thermoelectric power $S_e+S_{ph}$. The middle curve is the phonon contribution $S_{ph}$ and the bottom line is the electronic term $S_e$ arising from the fit. The fit has maximum error 6.1 μV/K and rms error 1.8 μV/K. The experimental error bars at 150, 200, and 225K are smaller than the data points. The data points above the bottom line are experimental values for bulk wires (doping $2\times10^{20}$ cm$^{-3}$) (crosses), 10 nm nanowires (doping $7\times10^{19}$ cm$^{-3}$) (diamonds), and 20 nm wires (doping $1.3\times10^{20}$ cm$^{-3}$) (triangles) where only a linear T electronic contribution was found. This data is close to the extracted electronic contribution from the black data points (blue line) and shows that the fitted linear term is reasonable. The drop in S to 0 as T→0 occurs because the phonon mean free path reaches the sample size and the specific heat→0 due to the third law of thermodynamics. The inset shows the character of a 3D bulk longitudinal acoustic phonon mode (top) and a 1D mode when the wavelength is larger or on the order of the width. The 1D mode incorporates the existence of the boundary by transverse expansion (compression) for longitudinal compression (expansion). The ratio of the transverse strain to the longitudinal strain is the Poisson ratio (0.29 for silicon).

Figure 7:
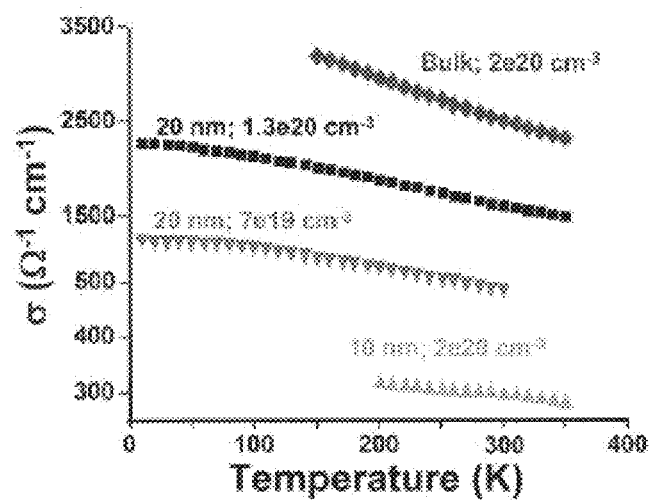
FIG. 7 shows electrical conductivity data for 20 nm and 10 nm wide nanowires along with a bulk silicon reference sample. The electrical conductivity is used to calculate ZT.

FIG. 7 shows representative electrical conductivity data for the single-crystal silicon nanowires and microwires; p-type doping levels are indicated. All nanowires are 20 nm in height. The electrical current carrying capacity of the nanowires is large. Therefore, the electrical conductivity is nearly unaffected by the size reduction from bulk to the nanoscale. This fact helps to maintain the large ZT values.

Figure 8:
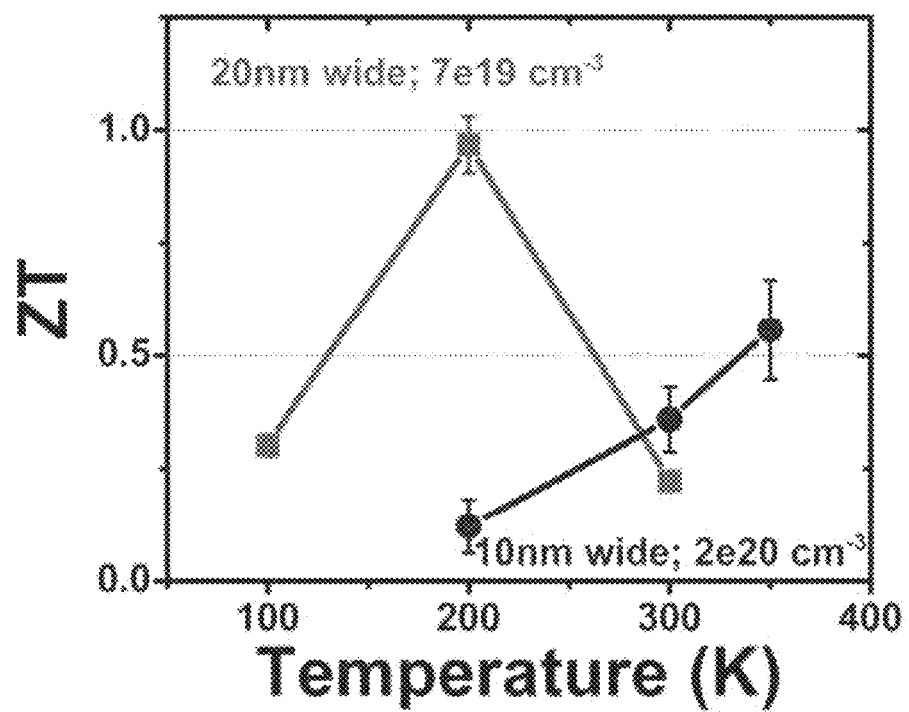
FIG. 8 shows the ZT data for a representative set of 20 nm and 10 nm wide silicon nanowires.

FIG. 8 shows that silicon thermoelectric nanowires have large efficiencies. In fact their efficiency is nearly 100 times larger than bulk. The figure shows temperature dependence of the thermoelectric efficiency, ZT, for two different groups of nanowires. The cross sectional area of the nanowires, and the p-type doping level, are given on the graph. The 20 nm wide nanowires have a thermoelectric power that is dominated by phonon contributions, and a ZT value ~1 is achieved near 200K. The smaller (10 nm wide) nanowires have a thermoelectric power that is dominated by electronic contributions. The ZT at 350K is calculated using the thermal conductivity value for the 10 nm nanowires at 300K. The error bars represent 95% confidence limits.

Figure 9A:
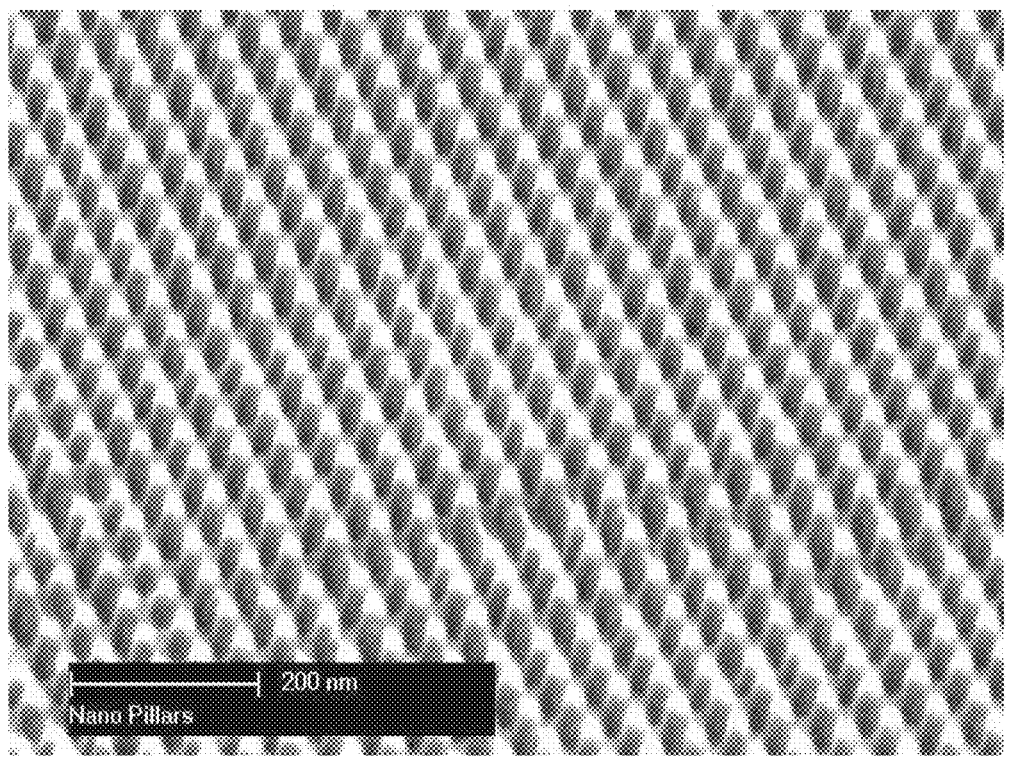
FIGS. 9A-9F show a micrograph of vertically standing silicon nanowires and depict a method to create a functioning thermoelectric circuit with p- and n-type nanowires. The example used here is based on silicon nanowires.

FIG. 9A shows how a micrograph of a vertical array of silicon semiconductor nanowires. The nanowires have a diameter of 20 nm and are fabricated by the SNAP process. The aspect ratio of the nanowires is currently 4, but this can be increased.

FIGS. 9B-9E show how a vertical array of nanowires can be doped into p- and n-type elements that are alternately connected electrically in series and thermally in parallel. The example used here is based on a silicon nanowire thermoelectric device.

Figure 9B:
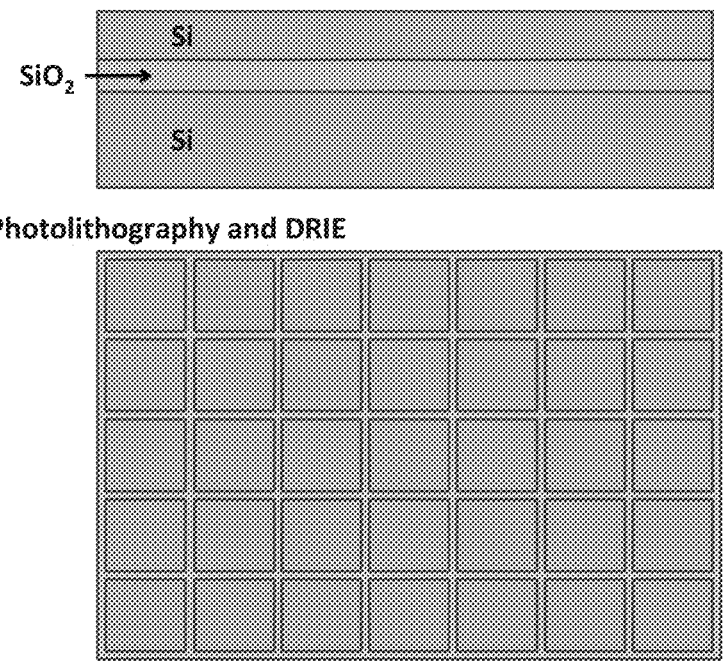

FIG. 9B shows a cross-section of the starting material for the thermoelectric device which is an un-doped silicon-on-insulator substrate. The electrical insulator is $SiO_2$. The top layer of silicon is several microns thick and will eventually be transformed into an array of alternately doped p- and n-type nanowires that are connected electrically in series and thermally in parallel. The very most top silicon layer is oxidized to a thickness of 100 nm and then coated with a photoresist. The oxide will act as an etch mask in a subsequent deep reactive ion etching (DRIE) step. Photolithography is then used to pattern the photoresist into a series of isolated square features several microns long on each side. Then the 100 nm of oxide in between the photoresist squares is removed using a buffered oxide etch of 1 part hydrofluoric acid and 5 parts water. DRIE is then performed to etch all the way down to the buried $SiO_2$ insulator layer. This step electrically isolates the silicon squares underneath the photoresist. The photoresist is then removed in acetone.

Figure 9C:
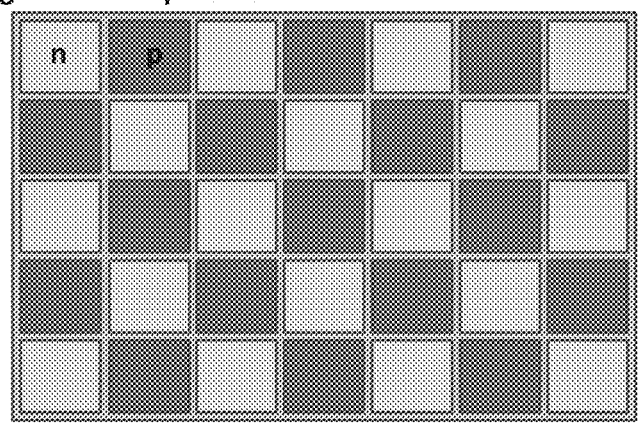

FIG. 9C shows a top view of each square alternately doped p- and n-type using photolithography masking and ion implantation techniques.

Figure 9D:
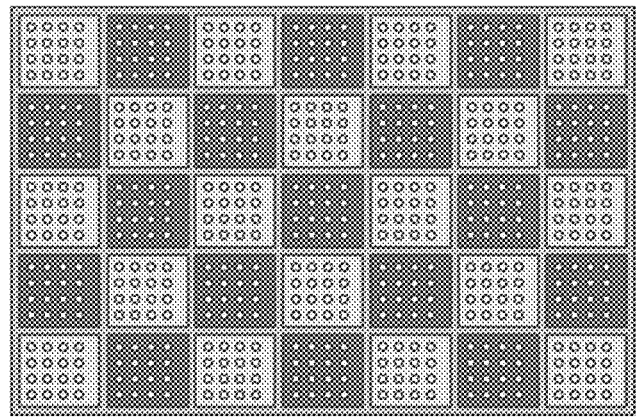

FIG. 9D shows a top view of round metallic circles 50 nm or smaller in diameter patterned on top of each square through SNAP and nano-imprint lithography techniques. The metallic circles act as etch masks for the subsequent etching of the top silicon layer using DRIE or wet etching to form the nanowires.

Figure 9E:
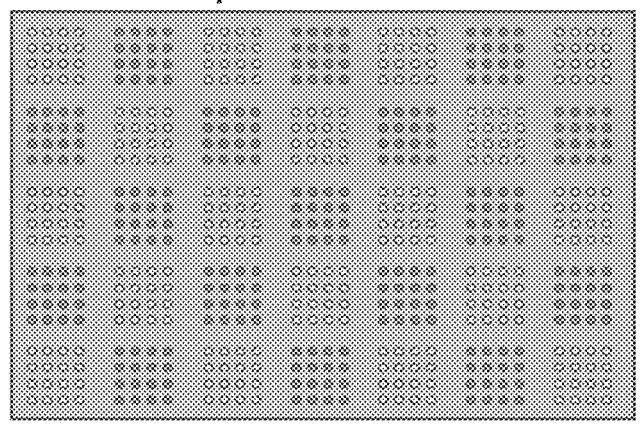

FIG. 9E shows a top view of how the nanowires are formed. The nanowires can be fabricated using a DRIE etch or wet etching. The etching stops when the exposed silicon (the silicon not directly underneath the metallic circles) is completely removed. The nanowires will have the same diameter as the metallic circles. The device now comprises alternately doped arrays of p- and n-type silicon nanowires.

Figure 9F:
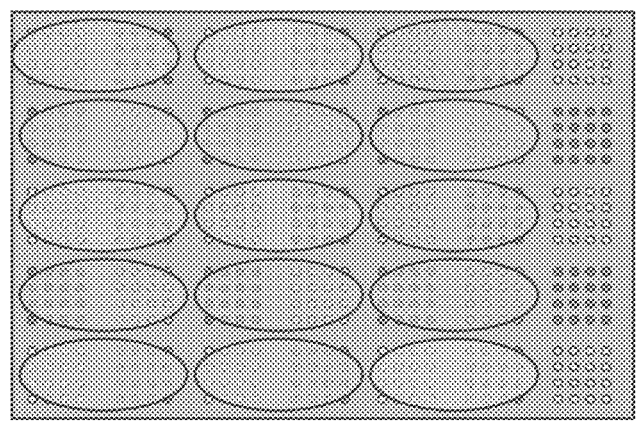

FIG. 9F shows a top view of the metallized top contacts (bottom contacts not shown). Metal contacts such as titanium and platinum electrically connect the alternately doped arrays of p- and n-type silicon nanowires in series and also allows them to be connected thermally in parallel.

Accordingly, what has been shown are semiconductor nanowire thermoelectric devices and related fabrication methods. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

The invention claimed is:

1. A thermoelectric device, comprising:
a nanowire array comprising an individual nanowire consisting essentially of doped silicon, wherein the individual nanowire comprises a semiconductor, and wherein the individual nanowire has a diameter up to about 20 nanometers (nm) and a length that is at least about 4 times the diameter of the individual nanowire,
wherein the individual nanowire is doped p-type or n-type, but not both, and has a doping concentration from about $3 \times 10^{19}$ cm$^{-3}$ to $2 \times 10^{20}$ cm$^{-3}$, and
wherein the individual nanowire has a thermoelectric efficiency that is at least one hundred times greater than a thermoelectric efficiency of bulk silicon, wherein the thermoelectric efficiency of the individual nanowire is greater than or equal to about 0.31 over a temperature range from about 100 K to 200 K.

2. The thermoelectric device of claim 1, wherein the individual nanowire is about 20 nm wide and p-type doped at a concentration of about $7 \times 10^{19}$ cm$^{-3}$.

3. The thermoelectric device of claim 2, wherein an electric conductivity of the individual nanowire changes less than 1,000 $\Omega^{-1}$ cm$^{-1}$ across a temperature range of 50K to 200K.

4. The thermoelectric device of claim 1, wherein the individual nanowire is about 20 nm wide and p-type doped at a concentration of about $1.3 \times 10^{20}$ cm$^{-3}$.

5. The thermoelectric device of claim 4, wherein an electric conductivity of the individual nanowire changes less than 1,000 $\Omega^{-1}$ cm$^{-1}$ across a temperature range of 50K to 200K.

6. The thermoelectric device of claim 1, wherein the thermoelectric efficiency of the individual nanowire is maximal at a temperature of about 200 K.

7. The thermoelectric device of claim 1, wherein the diameter is from about 10 nm to 20 nm.

8. The thermoelectric device of claim 1, further comprising electric contacts in electrical communication with the nanowire array.

9. The thermoelectric device of claim 8, wherein the electrical contacts include platinum.

10. The thermoelectric device of claim 8, wherein the electrical contacts include titanium.

11. The thermoelectric device of claim 1, wherein the nanowire array comprises a plurality of individual nanowires.

12. The thermoelectric device of claim 11, wherein the plurality of individual nanowires comprises one or more p-type elements alternately connected to one or more n-type elements.

13. The thermoelectric device of claim 11, wherein the plurality of individual nanowires are connected electrically in series.

14. The thermoelectric device of claim 11, wherein the plurality of individual nanowires are connected in parallel.

15. A thermoelectric device comprising at least one p-doped nanowire array and at least one n-doped nanowire array, wherein the at least one p-doped nanowire array and the at least one n-doped nanowire array being connected electrically in series and thermally in parallel,
wherein at least one nanowire array of the at least one p-doped nanowire array and the at least one n-doped nanowire array each comprises an individual nanowire consisting essentially of doped silicon, wherein the individual nanowire comprises a semiconductor, and wherein the individual nanowire has a diameter up to about 20 nanometers (nm) and a length that is at least about 4 times the diameter of the individual nanowire,
wherein the individual nanowire is doped p-type or n-type, but not both, and has a doping concentration from about $3 \times 10^{19}$ cm' to $2 \times 10^{20}$ cm$^{-3}$, and
wherein the individual nanowire has a thermoelectric efficiency that is at least one hundred times greater than a thermoelectric efficiency of bulk silicon, wherein the thermoelectric efficiency of the individual nanowire is greater than or equal to about 0.31 over a temperature range from about 100 K to 200 K.

16. The thermoelectric device of claim 15, wherein the at least one p-doped nanowire array comprises a plurality of p-doped semiconductor nanowires and the at least one n-doped nanowire array comprises a plurality of n-doped semiconductor nanowires.

17. The thermoelectric device of claim 16, wherein the p-doped semiconductor nanowires or the n-doped nanowires have ZT efficiency values above 1, wherein $$ZT = \frac{S^2 \sigma}{\kappa} T,$$

where S is the thermoelectric power of the thermoelectric device, $$S = \frac{dV}{dT},$$

σ is the electrical conductivity of the thermoelectric device, κ is the thermal conductivity of the thermoelectric device, and T is the temperature of the thermoelectric device.

* * * * *